(12) United States Patent
Kamizono et al.

(10) Patent No.: US 11,167,540 B2
(45) Date of Patent: Nov. 9, 2021

(54) METHOD FOR MANUFACTURING FLOW PATH DEVICE

(71) Applicant: TOKYO OHKA KOGYO CO., LTD., Kawasaki (JP)

(72) Inventors: Takashi Kamizono, Kawasaki (JP); Takashi Fujimoto, Kawasaki (JP); Takahiro Senzaki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/864,589

(22) Filed: May 1, 2020

(65) Prior Publication Data
US 2020/0361198 A1 Nov. 19, 2020

(30) Foreign Application Priority Data
May 13, 2019 (JP) .............................. JP2019-090870

(51) Int. Cl.
*B32B 38/00* (2006.01)
*B32B 37/10* (2006.01)

(52) U.S. Cl.
CPC .......... *B32B 38/0008* (2013.01); *B32B 37/10* (2013.01); *B32B 2310/0831* (2013.01); *B32B 2310/14* (2013.01)

(58) Field of Classification Search
CPC ......... B01L 2300/161; B01L 3/502707; B81B 2201/058; B81B 2203/0338;
(Continued)

(56) References Cited

U.S. PATENT DOCUMENTS

| 2007/0254204 A1* | 11/2007 | Shin | ..................... H01M 8/0221 429/450 |
| 2013/0126022 A1* | 5/2013 | Schoen | ............... B81C 1/00063 137/561 A |
| 2018/0072034 A1* | 3/2018 | Wasamoto | .............. B32B 17/10 |

FOREIGN PATENT DOCUMENTS

| EP | 2116853 A1 * | 11/2009 | ......... B81C 1/00071 |
| EP | 2116853 A1 | 11/2009 | |

(Continued)

OTHER PUBLICATIONS

Extended Search Report issued in European Patent Application No. 20173068.6, dated Oct. 2, 2020.

*Primary Examiner* — Vishal I Patel
(74) *Attorney, Agent, or Firm* — Knobbe Martens Olson & Bear LLP

(57) ABSTRACT

A method for manufacturing a flow path device internally provided with a flow path for allowing a liquid to flow by compression bonding two or more members to each other, in which the hydrophilic property of a surface of the flow path can be maintained for a long period of time. A flow path device is manufactured by forming a hydrophilic coating film using a treatment liquid including a hydrophilizing agent in at least one member, the coating film covering a surface of the member at a side to be joined to another member, then irradiating only a joining surface of the coating film with ultraviolet rays or plasma derived from an oxygen-containing gas in the member having the coating film, and irradiating at least the joining surface with ultraviolet rays or plasma derived from an oxygen-containing gas in a member having no coating film, and compression bonding the two or more members.

13 Claims, 1 Drawing Sheet

(58) Field of Classification Search
CPC . B32B 38/0008; B32B 37/10; B32B 2310/14; B32B 2310/0831; B81C 1/00206; B81C 1/00119; B81C 2203/036
See application file for complete search history.

(56) References Cited

FOREIGN PATENT DOCUMENTS

| | | |
|---|---|---|
| JP | 4993243 B2 | 8/2012 |
| WO | WO 2008/065880 A1 | 6/2008 |

\* cited by examiner

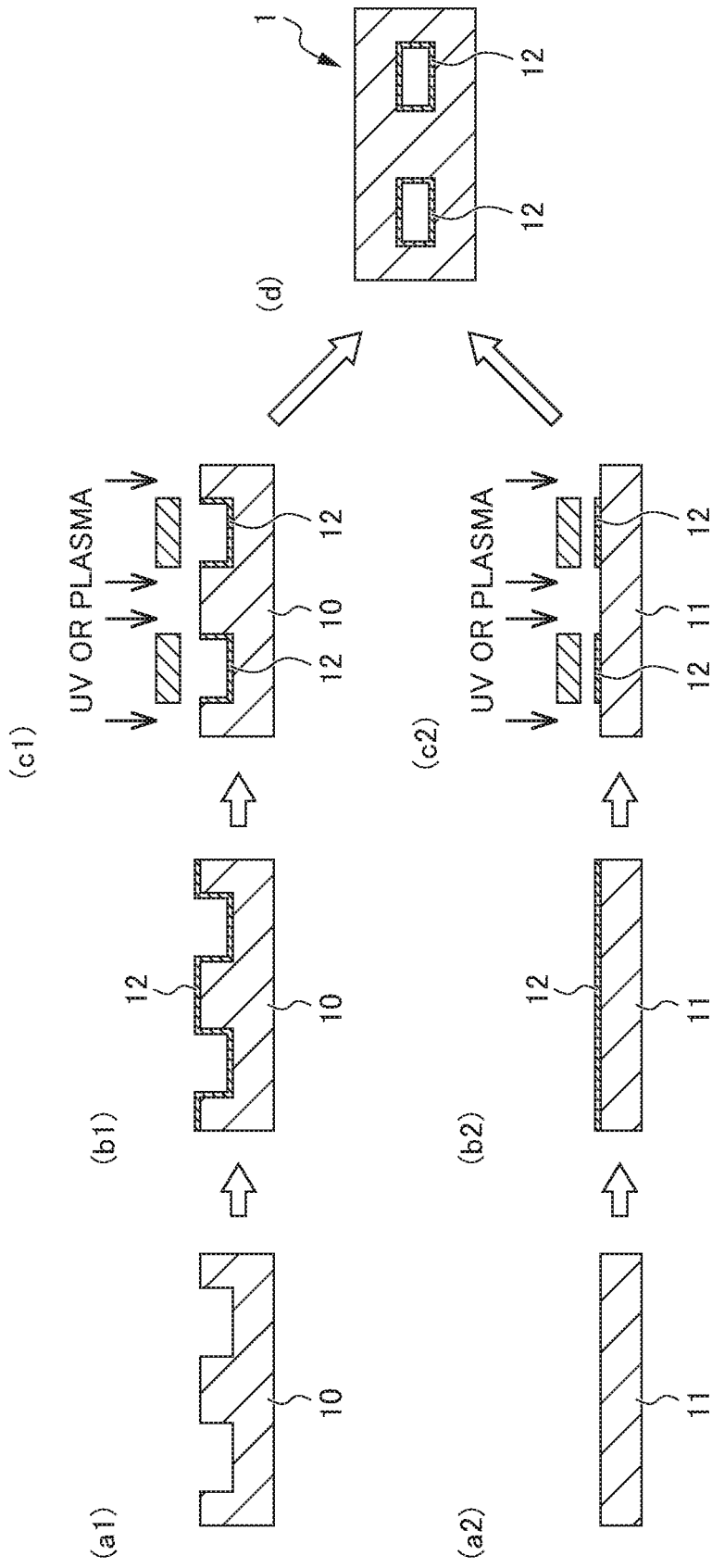

METHOD FOR MANUFACTURING FLOW PATH DEVICE

RELATED APPLICATION

This application claims priority to Japanese Patent Application No. 2019-090870, filed May 13, 2019, the entire content of which is incorporated herein by reference.

BACKGROUND OF THE INVENTION

Field of the Invention

The present invention relates to a method for manufacturing a flow path device internally provided with a flow path for allowing a liquid to flow.

Related Art

In recent years, in the field of a biochemical analysis or the like, a flow path device internally provided with a flow path for allowing a liquid to flow, for example, a micro flow path chip provided with a fine flow path has been widely used for the purpose of carrying out a precise analysis using a small amount of sample. In many cases, a liquid sample including water is allowed to flow in such a flow path device. Therefore, in order to allow a sample to smoothly flow in a fine flow path, a surface of the flow path of the flow path device is desired to be highly hydrophilic.

Examples of known methods for manufacturing a flow path device in which a surface of a flow path is hydrophilized include a method of irradiating parts of the flow path device made of resin such as polymethyl methacrylate, a cycloolefin polymer and polyether ether ketone with vacuum ultraviolet ray so as to hydrophilize and activate the surface of the parts, followed by compression-bonding the parts having been irradiated with vacuum ultraviolet rays to each other (Patent Document 1).

Patent Document 1: Japanese Patent No. 4993243

SUMMARY OF THE INVENTION

However, in the method of compression-bonding parts having been irradiated with vacuum ultraviolet rays as described in Patent Document 1, even if there is no problem in compression-bonding between the parts, the hydrophilic property of the surface of the flow path may be deteriorated over time.

The present invention has been made considering the above-mentioned problems, and has an object to provide a method for manufacturing a flow path device internally provided with a flow path for allowing a liquid to flow by compression-bonding two or more members to each other, wherein the hydrophilic property of the surface of the flow path can be maintained for a long period of time.

The inventors of the present invention have found that the above-mentioned problems can be solved when a flow path device is manufactured by forming a hydrophilic coating film using a treatment liquid including a hydrophilizing agent in at least one of two or more members constituting the flow path device, then irradiating only a joining surface (a joining portion) of the hydrophilic coating film in a member provided with the hydrophilic coating film, and then compression-bonding two or more members to each other, and reached the completion of the present invention.

Specifically, the present invention is a method for manufacturing a flow path device internally provided with a flow path for allowing a liquid to flow, the method including: a coating film formation step of preparing two or more members as members constituting the flow path device, and forming a hydrophilic coating film in at least one member of the members, using a treatment liquid including a hydrophilizing agent, the hydrophilic coating film covering a surface of the member at a side to be joined to another member; an irradiation step of selectively irradiating only a joining surface of the hydrophilic coating film with ultraviolet rays or plasma derived from an oxygen-containing gas in the member having the hydrophilic coating film, and irradiating at least the joining surface with ultraviolet rays or plasma derived from an oxygen-containing gas in the member having no hydrophilic coating film; and a compression bonding step of applying an external force to the two or more members disposed in predetermined positions such that the joining surfaces of the two or more members having been treated with the ultraviolet rays or the plasma face each other.

The present invention can provide a method for manufacturing a flow path device internally provided with a flow path for allowing a liquid to flow by compression bonding two or more members to each other, wherein the hydrophilic property of a surface of the flow path can be maintained for a long period of time.

BRIEF DESCRIPTION OF THE DRAWINGS

FIG. 1 is a view schematically showing a preferable embodiment of the present invention.

DETAILED DESCRIPTION OF THE INVENTION

<<Method for Manufacturing Flow Path Device>>

A method for manufacturing a flow path device internally provided with a flow path for allowing a liquid to flow includes: a coating film formation step of preparing two or more members as members constituting the flow path device, and forming a hydrophilic coating film in at least one member of the members, using a treatment liquid including a hydrophilizing agent, the hydrophilic coating film covering a surface of the member at a side to be joined to another member; an irradiation step of selectively irradiating only a joining surface of the hydrophilic coating film with ultraviolet rays or plasma derived from an oxygen-containing gas in the member having the hydrophilic coating film, and irradiating at least the joining surface with ultraviolet rays or plasma derived from an oxygen-containing gas in the member having no hydrophilic coating film; and a compression bonding step of applying an external force to the two or more members disposed in predetermined positions such that the joining surfaces of the two or more members having been treated with the ultraviolet rays or the plasma face each other.

A shape of the flow path device is not particularly limited. Examples of the shapes of the flow path device include a plate shape, a disk shape, a column shape, and prismatic shapes such as a trigonal prismatic shape, a square prismatic shape, and hexagonal prismatic shape, and the like.

The flow path of the flow path device may be a linear without branches, or may be a branched shape having one or more branch points. The flow path device may include only one flow path, or may include two or more flow paths.

A sectional shape of the flow path is not particularly limited. For example, from the viewpoint of ease of formation of flow paths by a photolithography method, an imprint method, and the like, the cross-sectional shape of the flow path is preferably quadrangular shapes such as a square shape, and a rectangular shape. On the other hand, from the viewpoint that fluid can be allowed to flow smoothly, solid contents are not likely to accumulate inside the flow path when a fluid flowing in the flow path includes solid contents, and the like, the cross-sectional shape of the flow path is preferably circular or substantially circular.

A cross-sectional area of the flow path is not particularly limited, and appropriately set according to applications of use of the flow path device. The cross-sectional area of the flow path may be constant or not constant inside the flow path device. Furthermore, the dimension of the cross-section of the flow path is not particularly limited. As the dimension of the cross-section of the flow path, a length of the minor axis of the Feret's diameters is preferably 1 mm or less, more preferably 500 μm or less, further more preferably 100 μm or less, and particularly preferably 50 μm or less. The lower limit of the length of the minor axis of the Feret's diameters is not particularly limited, and may be, for example, 1 μm or more, or may be 5 μm or more, and may be 10 μm or more. The Feret's diameter is a length of a side of a rectangular or a square shape circumscribed to the outer periphery of the cross section of the flow path and having the minimum area. When the cross-sectional shape is a circle, it is a value of the diameter of the circle. When the cross-sectional shape is a square, it is a length of one side of the square.

Consider, for example, a linear cross section of a rectangle having a width of 10 μm and a length of 50 μm bent at a position 25 μm from the end so that both ends overlap. In this case, the Feret's diameter is about 20 μm (=width 10 μm+width of 10 μm) and 25 μm (=length of 50 μm÷2). Therefore, the minor axis of the Feret's diameters is about 20 μm. In this case, as the minor axis of the Feret's diameter, 20 μm is employed.

Hereinafter, each step is described.

<Coating Film Formation Step>

In a coating film formation step, two or more members are prepared as members constituting a flow path device, and a hydrophilic coating film covering a surface at a side to be joined to another member of the members is formed using a treatment liquid including a hydrophilizing agent in at least one member of the members.

In the above-mentioned manufacturing method, the flow path device is manufactured by activating surfaces to be joined of the two or more members by irradiation with ultraviolet rays or plasma derived from an oxygen-containing gas, and compression bonding the two or more members to each other.

A material of the members is not particularly limited as long as it can be compression-bonded by activation by irradiation with ultraviolet rays or plasma derived from an oxygen-containing gas. The material of the members may be inorganic materials or organic materials represented by resins. In each member, a material of the surface at a side to be joined to another member is preferably at least one or more materials selected from the group consisting of silicon, glass, silicone resin, a cyclic olefin polymer, a cyclic olefin copolymer, an acrylic resin, a polyester resin, and a polycarbonate resin from the viewpoint of easiness of adhesion of a hydrophilic coating film, and easiness of activation by irradiation with ultraviolet rays or plasma.

In the above-mentioned manufacturing method, usually, at least two of the two or more members have a surface for forming the flow path. Then, a hydrophilic coating film is formed on the surface for forming the flow path. Since an object is to manufacture a flow path device whose flow path surface is hydrophilized, in this case, a portion that is not irradiated with ultraviolet rays or plasma derived from an oxygen-containing gas in the hydrophilic coating film is a flow path surface of the flow path device. This is because in a portion in which the hydrophilic coating film has been irradiated with ultraviolet rays or plasma derived from an oxygen-containing gas, at least a part or entire part of the hydrophilic coating film is removed.

Furthermore, it is preferable that a hydrophilic coating film is formed in all of the two or more members constituting the flow path device. When the hydrophilic coating film is formed in all of the two or more members constituting the flow path device, the entire surface of the flow path is satisfactorily hydrophilized.

In the coating film formation step, depending on material of the member, before the hydrophilic coating film is formed, treatment of irradiating a surface on which a hydrophilic coating film is formed on a member constituting a flow path device with ultraviolet rays or plasma derived from an oxygen-containing gas, or treatment of bringing the surface into contact with oxidant may be carried out. When a hydrophilic coating film is formed after such treatment is carried out, the hydrophilic coating film can be strongly attached to the surface of the member.

When an oxidant is used in the above treatment performed before the coating film formation step, the oxidant is preferably at least one selected from the group consisting of a sulfuric acid, a nitric acid, a chromic acid, a permanganic acid, a persulfuric acid, and a mixed acid.

The hydrophilizing agent may be an organic compound or an inorganic compound. Since compression bonding of surfaces irradiated with ultraviolet rays or plasma is easily performed when a surface on which a hydrophilic coating film is formed is irradiated with an ultraviolet rays or plasma derived from an oxygen-containing gas, the hydrophilizing agent is preferably an organic compound. It is preferable because when the hydrophilic coating film mainly includes an organic compound, by irradiation with an ultraviolet ray or plasma, removal of the hydrophilic coating film and activation of the surface of the member by irradiation with ultraviolet rays or plasma satisfactorily proceeds at the same time.

A method for applying a treatment liquid onto the surface of the member is not particularly limited. Specific examples of the application method include a spin coating method, a spray method, a roller coating method, a soaking method, and the like. When the member is a plate like, from the viewpoint of easiness in uniform application of the treatment liquid, the application method is preferably a spin coating method.

In order to make a hydrophilic coating film thin, a coating film that has been formed by applying a treatment liquid may be rinsed. The rinsing liquid is not particularly limited as long as the liquid can form a coating film having a predetermined film thickness. Examples of the rinsing liquid include water, an organic solvent, and an aqueous solution of the organic solvent. The rinsing liquid is preferably water. A method for rinsing the coating film is not particularly limited. Typically, by the same method as the application method described above, by bringing a rinsing liquid into contact with the coating film, the coating film is rinsed.

A film thickness of the hydrophilic coating film is not particularly limited within a range where the objects of the present invention are not impaired. The film thickness of the hydrophilic coating film is preferably, for example, 100 nm or less, and more preferably 10 nm or less, and preferably 0.1 nm or more. The lower limit of the film thickness of the hydrophilic coating film is further preferably 0.5 nm or more. Among the range of the above-mentioned film thickness, the film thickness is particularly preferably 0.5 nm or more and 5 nm or less, and most preferably 0.5 nm or more and 3 nm or less.

When the film thickness of a hydrophilic coating film 12 is within the above-mentioned range, a sufficient hydrophilic effect is easily obtained. When a surface on which the hydrophilic coating film 12 has been formed is irradiated with ultraviolet rays or plasma derived from an oxygen-containing gas, compression bonding of the surface having been irradiated with ultraviolet rays or plasma derived from an oxygen-containing gas is easily performed. The thickness of the hydrophilic coating film 12 can be adjusted by adjusting a solid content concentration of a treatment liquid, a film thickness of the coating film when the treatment liquid is applied, a use amount of the rinsing liquid, types of the rinsing liquid, temperatures of the rinsing liquid, and the like.

The treatment liquid used in formation of the hydrophilic coating film is not particularly limited as long as it can form a coating film that hydrophilizes the surface of the member.

As the treatment liquid to be used in formation of the hydrophilic coating film, a solution of a resin having a hydrophilic group is preferably used. A solvent included in such a treatment liquid is not particularly limited as long as it can dissolve the resin. Examples of the preferable solvents include solvents described for (B) solvents included in the below-mentioned first treatment liquid. The concentration of a resin in the treatment liquid including the resin having the hydrophilic property group is not particularly limited. The concentration of the resin in the treatment liquid is appropriately determined in consideration with a film thickness of the hydrophilic coating film or the coating characteristics of the treatment liquid. The resin having a hydrophilic group is not particularly limited. Examples of the resin having a hydrophilic group include a (meth)acrylic resin, a novolac resin, a polyester resin, a polyamide resin, a polyimide resin, a polyamide-imide resin, a polyalkyleneimine resin (for example, a polyethyleneimine resin), a silicone resin, and the like. Among such resins, a (meth)acrylic resin is preferable because of easiness in introduction of a functional group, and adjustment of the content ratio of units each having a functional group. Specific examples of the hydrophilic group include a polyoxyalkylene group (for example, a polyoxyethylene group, a polyoxypropylene group, a polyoxyalkylene group in which an oxyethylene group and an oxypropylene group are block-bonded or randomly-bonded to each other, and the like), an amino group, a carboxy group, a hydroxyl group, a sulfonic acid group, and the like. Furthermore, an organic group including these groups is preferable as the hydrophilic group. Furthermore, a cationic group including an anion moiety and a cation moiety that can be bonded to the resin is also preferable as the hydrophilic group. Examples of the cation moiety constituting the cationic group include a nitrogen-containing cation moiety, a sulfur-containing cation moiety, an iodine-containing cation moiety, a phosphorus-containing cation moiety, and the like. Anions constituting the anion moiety are not particularly limited. Valency of the anion is not particularly limited, and a monovalent anion or a divalent anion is preferable, and a monovalent anion is more preferable. Suitable examples of the monovalent anion as the anion moiety include a halide ion, a hydroxide ion, a nitrate ion, various types of organic acid ions derived from organic carboxylic acids or organic sulfone acid, and the like. Among them, a halide ion is preferable, a chloride ion, bromide ion, an iodide ion, and a fluoride ion are more preferable, a chloride ion and a bromide ion are further preferable, and a chloride ion is particularly preferable. Preferable examples of the cationic group include groups including a quaternary ammonium salt group, groups including salts of nitrogen-containing aromatic heterocyclic group, groups including sulfonium salt groups, groups including iodonium salt groups, groups including phosphonium salt groups, and the like. Among these cationic groups, the groups including quaternary ammonium salt group are preferable because they are easily introduced into the resin, and have a high effect of hydrophilization, and the like. Furthermore, for the purpose of imparting adhesion to the members or durability against peeling to the hydrophilic coating film, the resin may include an epoxy group containing group such as a glycidyl group, an oxetanyl group-containing group, hydrolytic condensable reactive silyl groups such as a trimethoxysilyl group and a triethoxysilyl groups.

Examples of the preferable treatment liquid to be used for formation of the hydrophilic coating film include the treatment liquid described in Japanese Unexamined Patent Application, Publication No. 2018-159039. The treatment liquid described in Japanese Unexamined Patent Application, Publication No. 2018-159039 includes resin and a solvent. The resin has a functional group I that is one or more groups selected from the group consisting of a hydroxyl group, a cyano group, and a carboxy group, and a functional group II that is a hydrophilic group other than the functional group I. However, when the functional group II includes one or more groups selected from a hydroxyl group, a cyano group, and a carboxy group, the resin may not have a functional group I. In the treatment liquid described in Japanese Unexamined Patent Application, Publication No. 2018-159039, the weight-average molecular weight of the resin is 100,000 or more.

The treatment liquid described in Japanese Unexamined Patent Application, Publication No. 2018-095756 can also be preferably used for forming a hydrophilic coating film. The treatment liquid described in Japanese Unexamined Patent Application, Publication No. 2018-095756 includes a resin, an ionic compound, and a hydrated solvent. The resin is water-soluble resin having an anionic group and/or a cationic group. The ionic compound is a water-soluble non-polymer compound.

A two-liquid type treatment liquid composed of a first liquid and a second liquid described in Japanese Unexamined Patent Application, Publication No. 2018-094516 can also be preferably used for forming a hydrophilic coating film. In the treatment liquid described in Japanese Unexamined Patent Application, Publication No. 2018-094516, the first liquid includes a resin and a hydrated solvent. The resin included in the first liquid is a water-soluble resin having an anionic group and/or a cationic group. The second liquid includes an ionic compound and a hydrated solvent. The ionic compound included in the second liquid is a water-soluble non-polymer compound. When the hydrophilic coating film is formed using the two-liquid type treatment liquid including the first liquid and the second liquid described in Japanese Unexamined Patent Application, Publication No. 2018-094516, the first liquid is applied and then the second liquid is brought into contact with the place on which the first liquid has been applied.

The treatment liquid described in Japanese Unexamined Patent Application, Publication No. 2017-061682 can also be preferably used for forming a hydrophilic coating film. The treatment liquid described in Japanese Unexamined Patent Application, Publication No. 2017-061682 includes a resin, strong acid, and a solvent. The resin has a functional group I that is one or more groups selected from the group consisting of a hydroxyl group, a cyano group, and a carboxy group, and a functional group II that is a hydrophilic group other than the functional group I. However, when the functional group II includes one or more groups selected from a hydroxyl group, a cyano group, and a carboxy group, the resin may not have a functional group I. The strong acid included in the treatment liquid described in Japanese Unexamined Patent Application, Publication No. 2017-061682 has pKa of 1 or less.

Specific examples of the particularly preferable treatment liquid include an (A) resin and a (B) solvent, wherein a ratio of a structural unit having an anionic group to total structural units of the (A) resin is 5 mol % or less, the (A) resin has a functional group I that is a hydroxyl group and/or a cyano group, and a functional group II that is a hydrophilic group other than the functional group I, wherein when the functional group II includes a hydroxyl group and/or a cyano group, the (A) resin may not include the functional group I. This treatment liquid is described as a "first treatment liquid".

The first treatment liquid can be used for surface treatment of various base materials. In particular, the first treatment liquid is preferably used for forming a hydrophilic coating film on a member including polyorganosiloxane on at least a part of the surface. In the case of using the first treatment liquid that satisfies the above-described predetermined requirements, the base material including polyorganosiloxane on at least a part of the surface thereof can be made highly hydrophilic over a long period of time.

The polyorganosiloxane is not particularly limited. Specific examples of the polyorganosiloxane include polydimethylsiloxane, polymethylethylsiloxane, polymethylphenylsiloxane, polymethylpropylsiloxane, polydiphenylsiloxane, polymethylbutylsiloxane, and the like. Among them, polydimethylsiloxane is preferable because it is easily obtained.

Hereinafter, components included in a first treatment liquid are described.

((A) Resin)

(A) Resin has a functional group I that is a hydroxyl group and/or a cyano group. The (A) resin has also a functional group II that is a hydrophilic group other than the functional group I. Use of a treatment liquid including the (A) resin having a hydrophilic group allows for a hydrophilic treatment. The hydrophilic group is not particularly limited, and may be selected appropriately from functional groups which have been conventionally recognized as hydrophilic groups by a person skilled in the art.

Types of the (A) resin are not particularly limited as long as the (A) resin has a predetermined functional group, and is soluble to a (B) solvent. Examples of the (A) resin include (meth)acrylic resin, novolac resin, polyester resin, polyamide resin, polyimide resin, polyamide-imide resin, silicone resin, and the like. Among such resin, (meth)acrylic resin is preferable because of easiness in introduction of a functional group, and adjustment of the content ratio of units each having a functional group, and the like.

Specific examples of the hydrophilic group include a polyoxyalkylene group (for example, a polyoxyethylene group, a polyoxypropylene group, a polyoxyalkylene group in which an oxyethylene group and an oxypropylene group are block-bonded or randomly-bonded to each other, and the like), an amino group, a carboxy group, a hydroxyl group, a sulfonic acid group, and the like. Furthermore, an organic group including these groups is preferable as the hydrophilic group.

Furthermore, a cationic group including an anion moiety and a cation moiety that can be bonded to the (A) resin is also preferable as the hydrophilic group. Examples of the cation moiety constituting the cationic group include a nitrogen-containing cation moiety, a sulfur-containing cation moiety, an iodine-containing cation moiety, a phosphorus-containing cation moiety, and the like.

Anions constituting the anion moiety are not particularly limited. Valency of the anion is not particularly limited, and a monovalent anion or a divalent anion is preferable, and a monovalent anion is more preferable. Suitable examples of the monovalent anion as the anion moiety include a halide ion, a hydroxide ion, a nitrate ion, various types of organic acid ions derived from organic carboxylic acids or organic sulfone acid, and the like. Among them, a halide ion is preferable, a chloride ion, bromide ion, an iodide ion, and a fluoride ion are more preferable, a chloride ion and a bromide ion are further preferable, and a chloride ion is particularly preferable.

Preferable examples of the cationic group include groups including a quaternary ammonium salt group, groups including salts of nitrogen-containing aromatic heterocyclic group, groups including sulfonium salt groups, groups including iodonium salt groups, groups including phosphonium salt groups, and the like. Among these cationic groups, the groups including quaternary ammonium salt group are preferable because they are easily introduced into the (A) resin, and have a high effect of hydrophilization, and the like.

The quaternary ammonium salt group as the cationic group is preferably a group represented by the following formula (A-I):

$$-R^{4a}-N^+R^{1a}R^{2a}R^{3a}\cdot X^- \quad (A\text{-}I)$$

(in the formula (A-I), $R^{1a}$, $R^{2a}$, and $R^{3a}$ are each independently an alkyl group having 1 or more and 4 or less carbon atoms, bonded to $N^+$, and two of $R^{1a}$, $R^{2a}$, and $R^{3a}$ may be bonded to each other to form a ring, and $R^{4a}$ is an alkylene group having 1 or more and 4 or less carbon atoms, and $X^-$ is a monovalent anion).

The alkyl group having 1 or more and 4 or less carbon atoms as $R^{1a}$, $R^{2a}$, and $R^{1a}$ may be linear or branched, and is preferably linear. Suitable specific examples of $R^{1a}$, $R^{2a}$, and $R^{3a}$ include a methyl group, an ethyl group, an n-propyl group, and an n-butyl group.

The alkylene group having 1 or more and 4 or less carbon atoms as $R^{4a}$ may be linear or branched, and is preferably linear. Suitable specific examples of $R^{4a}$ include a methylene group, an ethane-1,2-diyl group, a propane-1,3-diyl group, and a butane-1,4-diyl group.

Suitable examples of $X^-$ are the same as those of the suitable examples of the anions constituting the anion moiety described above.

Note here that the (A) resin includes anionic groups such as a carboxy group and a sulfonic acid group as the hydrophilic group, the ratio of a structural unit having an anionic group to total structural units of the (A) resin is 5 mol % or less.

When the (A) resin has a hydrophilic group including a hydroxyl group and/or a cyano group as the functional group II, the hydroxyl group and/or the cyano group included in the hydrophilic group also serves as the functional group I. Therefore, when the (A) resin has a hydrophilic group including the hydroxyl group and/or the cyano group as the functional group II, the (A) resin may not have the functional group I. Note here that the hydrophilic group including a hydroxyl group includes the hydroxyl group itself.

From the viewpoint that an excellent effect of hydrophilization of the treatment liquid is achieved, the hydrophilic group is preferably a group represented by the following formula (A1):

—NH—R' (A1)

(in the formula (A1), $R^1$ represents an alkyl group having 1 or more and 4 or less carbon atoms substituted with one or more groups selected from the group consisting of an amino group, a sulfonic acid group, and a hydroxyl group, a quaternary ammonium salt group represented by the formula (A-I) described above, or a hydrogen atom).

Specific examples of the hydrophilic group represented by formula (A1) include an amino group, and groups having $R^1$ represented by the following formulae, and the like.

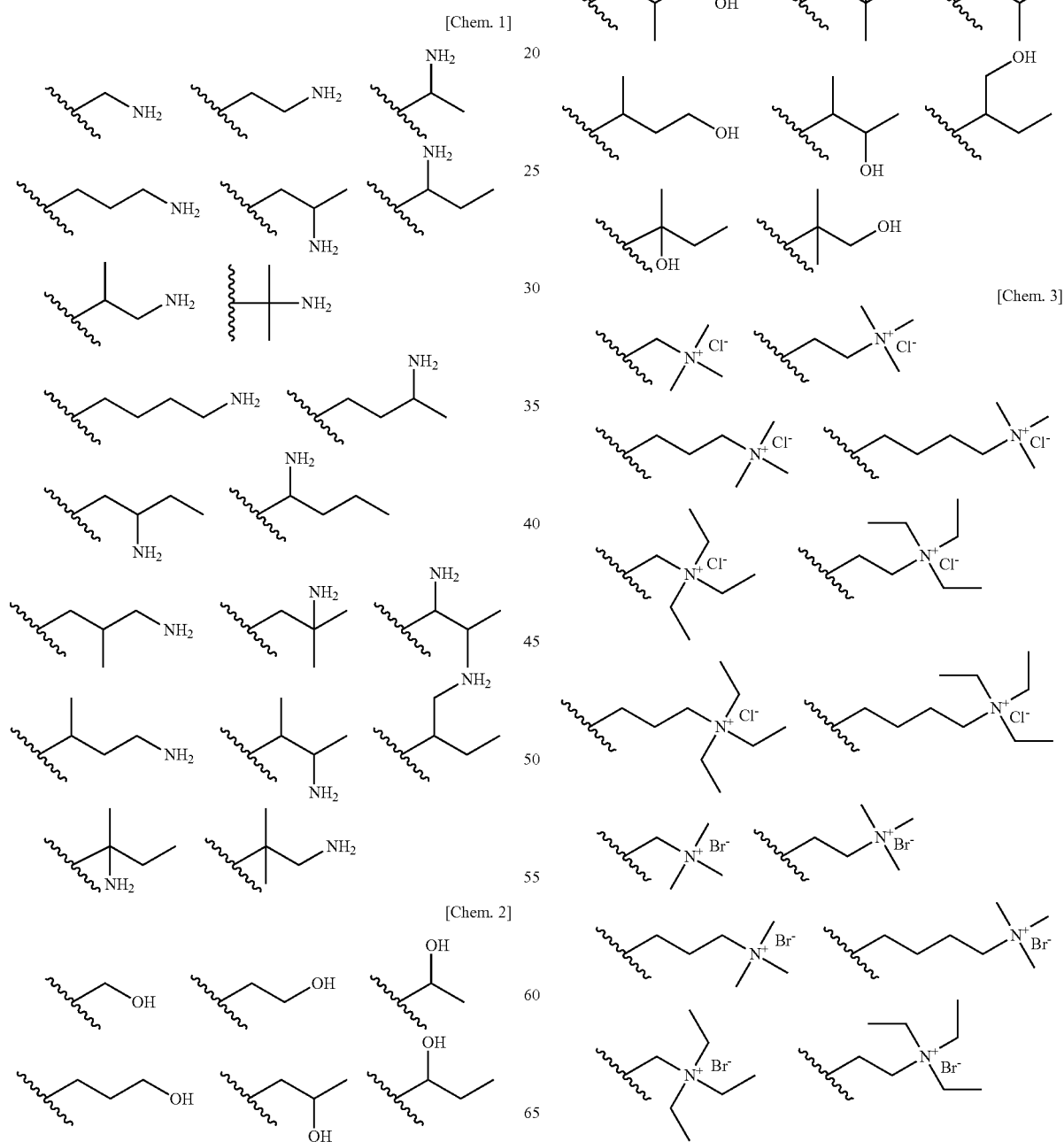

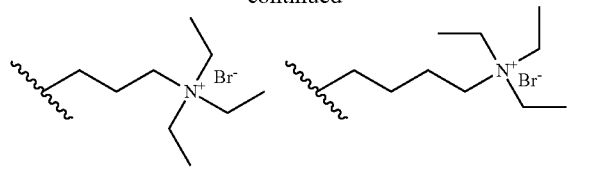

Among the specific examples of the hydrophilic groups represented by the above-mentioned formula (A1), the groups having $R^1$ represented by the following formulae are more preferable.

[Chem. 4]

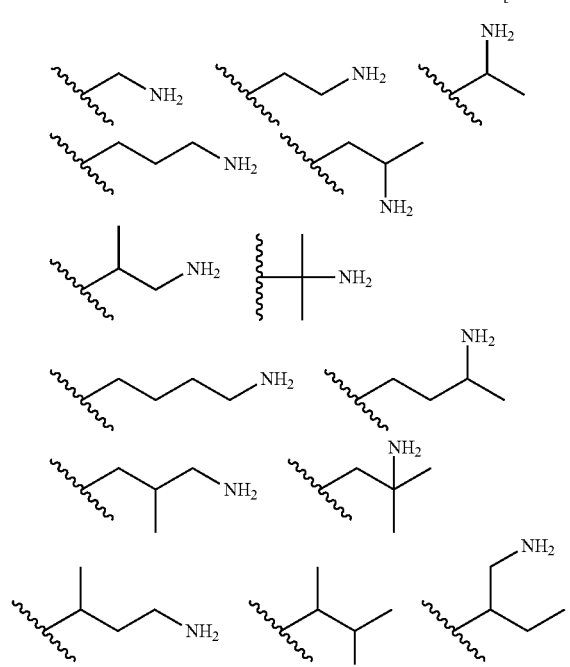

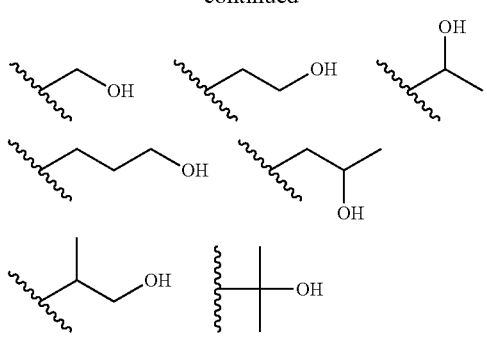

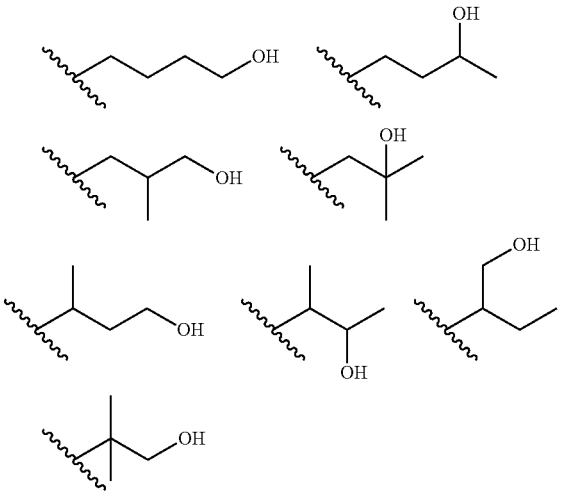

Among the specific examples of the hydrophilic groups represented by the above-mentioned formula (A1), the groups having $R^1$ represented by the following formulae are particularly preferable.

[Chem. 5]

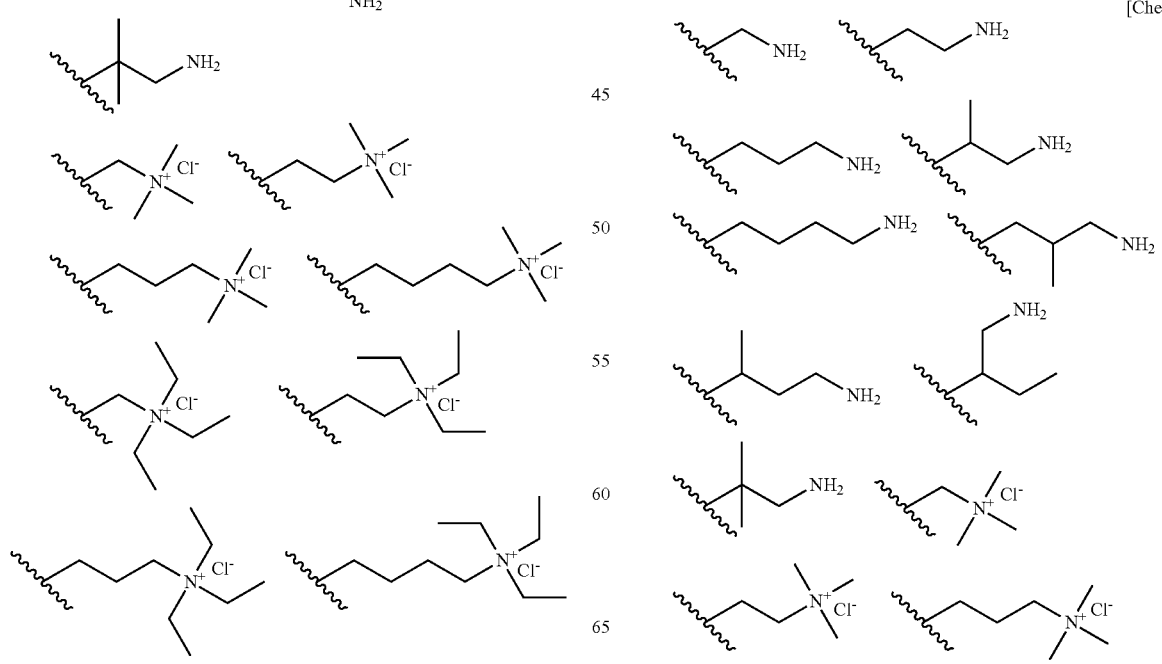

As the (A) resin, a polymer of a monomer having an unsaturated bond is preferable because various functional groups are easily introduced and the amount of the functional group is easily adjusted. Such a polymer may be a homopolymer or a copolymer.

In this case, the functional group I of the (A) resin is preferably a group derived from a monomer represented by the following formula (A2):

$$CH_2=CR^2-(R^3)_a-CO-R^4 \quad (A2)$$

(in the formula (A2), $R^2$ is a hydrogen atom or a methyl group, $R^3$ is a divalent hydrocarbon group, a is 0 or 1, $R^4$ is $-OH$, $-O-R^5$, or $-NH-R^5$, and $R^5$ is a hydrocarbon group substituted with a hydroxyl group and/or a cyano group).

In the above-mentioned formula (A2), $R^3$ is a divalent hydrocarbon group. The number of carbon atoms of the divalent hydrocarbon group is not particularly limited within a range in which the object of the present invention is not impaired. Because the (A) resin is easily obtained or prepared, the number of carbon atoms of the divalent hydrocarbon group as $R^3$ is preferably 1 or more and 20 or less, more preferably 1 or more and 12 or less, particularly preferably 1 or more and 10 or less, and the most preferably 1 or more and 6 or less.

The divalent hydrocarbon group as $R^3$ may be an aliphatic group, an aromatic group, and a hydrocarbon group including an aliphatic moiety and an aromatic moiety. When the divalent hydrocarbon group is an aliphatic group, the aliphatic group may be a saturated aliphatic group or an unsaturated aliphatic group. Furthermore, a structure of the aliphatic group may be a linear, branched, or cyclic, or a combination of these structures.

Specific examples of $R^3$ include a methylene group, an ethane-1,2-diyl group, an ethane-1,1-diyl group, a propane-1,3-diyl group, a propane-1,1-diyl group, a propane-2,2-diyl group, an n-butane-1,4-diyl group, an n-pentane-1,5-diyl group, an n-hexane-1,6-diyl group, an n-heptane-1,7-diyl group, an n-octane-1,8-diyl group, an n-nonane-1,9-diyl group, an n-decane-1,10-diyl group, an o-phenylene group, an m-phenylene group, a p-phenylene group, a naphthalene-2,6-diyl group, a naphthalene-2,7-diyl group, a naphthalene-1,4-diyl group, a biphenyl-4,4'-diyl group, and the like.

$R^4$ is $-OH$, $-O-R^5$, or $-NH-R^5$, and $R^5$ is a hydrocarbon group substituted with a hydroxyl group and/or a cyano group. The hydrocarbon group constituting a main skeleton of the group of $R^5$ may be a linear, branched, or cyclic aliphatic group, or an aromatic hydrocarbon group. The number of carbon atoms of the linear, branched, or cyclic aliphatic group is preferably 1 or more and 20 or less, and more preferably 1 or more and 12 or less. Suitable examples of the linear or branched aliphatic group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a sec-pentyl group, a tert-pentyl group, an n-hexyl group, an n-heptyl group, an n-octyl group, an n-nonyl group, an n-decyl group, and the like. Suitable examples of the cyclic aliphatic group include cycloalkyl groups such as a cyclopropyl group, a cyclobutyl group, a cyclopentyl group, a cyclohexyl group, a cycloheptyl group, and a cyclooctyl group; groups in which one hydrogen atom is removed from polycycloalkanes such as adamantane, norbornane, isobornane, tricyclodecane, and tetracyclododecane, groups in which one hydrogen atom is removed from C1-C4 alkyl substitutes of the above-listed polycycloalkanes, or the like. Suitable examples of the aromatic hydrocarbon group include a phenyl group, a naphthyl group, an anthranil group, a phenanthrenyl group, a biphenylyl group, and the like. The aromatic hydrocarbon group may be substituted with a C1-C4 alkyl group such as a methyl group and an ethyl group.

Particularly preferable specific examples of the unit derived from a monomer represented by formula (A2) include the following units a2-1 to a2-8. Among the following units a2-1 to a2-8, units a2-1 to a2-3 are more preferable.

[Chem. 6]

a2-1

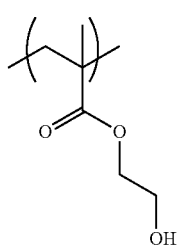

a2-2
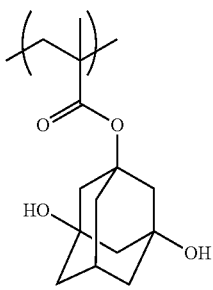

a2-3
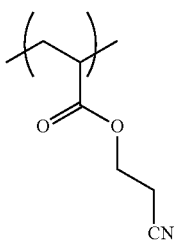

a2-4
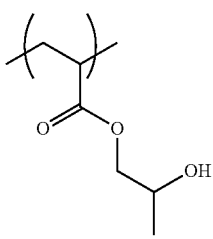

a2-5
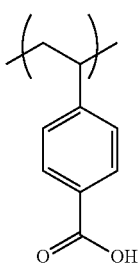

a2-6
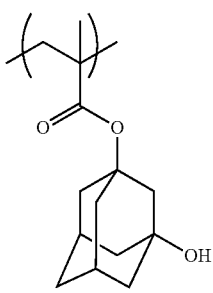

a2-7
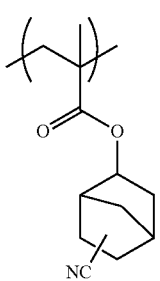

a2-8
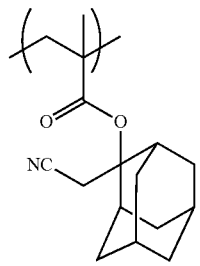

Furthermore, the functional group II that is a hydrophilic group in the (A) resin is preferably derived from a monomer represented by the following formula (A3):

(in the formula (A3), $R^1$ is an alkyl group having 1 or more and 4 or less carbon atoms substituted with one or more groups selected from the group consisting of an amino group, a sulfonic acid group, and a hydroxyl group; a quaternary ammonium salt group represented by the above-described formula (A-I) or a hydrogen atom; and $R^2$ is a hydrogen atom or a methyl group).

In the formula (A3), $R^1$ is as described above. $R^1$ is preferably a quaternary ammonium salt group represented by the above-described formula (A-I).

In other words, it is preferable that the (A) resin includes, as a unit derived from a monomer represented by the above-mentioned formula (A3), a structural unit derived from the monomer represented by the following formula (A4):

(in the formula (A5), $R^2$ is a hydrogen atom or a methyl group, $R^{1a}$, $R^{2a}$, $R^{3a}$, $R^{4a}$, and $X^-$ are the same as those in the above-described formula (A-I)).

Particularly preferable specific examples of the unit having a hydrophilic group derived from a monomer represented by the formula (A3) include the following units a3-1 to a3-5.

[Chem. 7]

a3-1
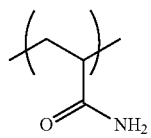

a3-2
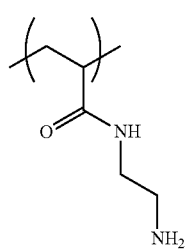

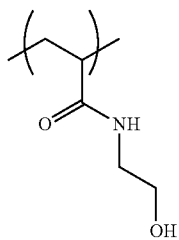

a3-3

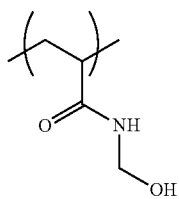

a3-4

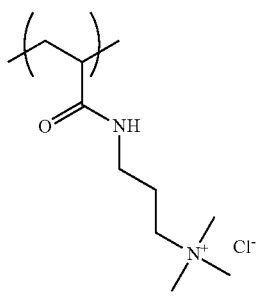

a3-5

When the (A) resin is a polymer of a monomer having an unsaturated bond, such a polymer may include constituent units other than the unit derived from the monomer represented by the formula (A2), and the unit derived from the monomer represented by the formula (A3) described above within a range in which the object of the present invention is not impaired.

Examples of the other constituent units include constituent units derived from monomers such as methyl(meth)acrylate, ethyl(meth)acrylate, isopropyl(meth)acrylate, n-propyl(meth)acrylate, n-butyl(meth)acrylate, isobutyl (meth)acrylate, tert-butyl(meth)acrylate, n-pentyl(meth)acrylate, isopentyl(meth)acrylate, phenyl(meth)acrylate, N-methyl(meth)acrylamide, N-ethyl(meth)acrylamide, N-n-propyl(meth)acrylamide, N-isopropyl(meth)acrylamide, N-n-butyl(meth)acrylamide, N-n-pentyl(meth)acrylamide, N-isopentyl(meth)acrylamide, N-phenyl(meth)acrylamide, N,N-dimethyl(meth)acrylamide, N,N-diethyl(meth)acrylamide, N,N-di-n-propyl(meth)acrylamide, N,N-di-n-butyl (meth)acrylamide, N,N-di-n-pentyl(meth)acrylamide, styrene, α-methyl styrene, β-methyl styrene, o-methyl styrene, m-methyl styrene, p-methyl styrene, and chlorostyrene.

When the (A) resin is a polymer of a monomer having an unsaturated bond, the ratio of constituent units derived from the monomer represented by the formula (A2) in the total constituent units included in such a polymer is preferably 0.1 mol % or more and 50 mol % or less, more preferably 1 mol % or more and 20 mol % or less, and particularly preferably 1 mol % or more and 15 mol % or less.

When the (A) resin is a polymer of a monomer having an unsaturated bond, the mole ratio of constituent units derived from the monomers represented by the formula (A3) to the total constituent units is preferably 50 mol % or more and 99.9 mol % or less, more preferably 60 mol % or more and 99 mol % or less, and particularly preferably 70 mol % or more and 99 mol % or less. However, when the constituent units derived from the monomer represented by formula (A3) include a hydroxyl group and/or a cyano group, the ratio of constituent units derived from the monomer represented by formula (A3) to the total constituent units included in the polymer may be 100%.

The weight-average molecular weight of the (A) resin is preferably 100,000 or more. When the (A) resin having such a molecular weight is used, at the time of treatment with a treatment liquid, the (A) resin is easily bonded or attached to the first member 10 and/or the second member 11 by reaction or interaction between the functional group I and a surface of the treatment target. Since an excellent effect of surface treatment is achieved, the weight-average molecular weight of the (A) resin is preferably 200,000 or more, and more preferably 300,000 or more. The weight-average molecular weight of the (A) resin may be 1,000,000 or more as long as the (A) resin is soluble in a (B) solvent described later. The upper limit of the weight-average molecular weight of the (A) resin is not particularly limited as long as the (A) resin is soluble in the (B) solvent. The weight-average molecular weight of the (A) resin may be, for example, 2,500,000 or less, and may be 4,000,000 or less.

The amount of the (A) resin included in the treatment liquid is not particularly limited within a range in which the object of the present invention is not impaired, and the amount can be appropriately determined considering the application property of the treatment liquid. Typically, the amount of the (A) resin in the treatment liquid preferably has the following relationship between the (A) resin and the amount of a (B) solvent to be described later. When the mass of the (A) resin in the treatment liquid is 100 parts by mass, the amount of the (B) solvent to be described later is preferably 100 parts by mass or more and 10000 parts by mass or less, more preferably 500 parts by mass or more and 8000 parts by mass or less, and particularly preferably 1000 parts by mass or more and 6000 parts by mass or less.

((B) Solvent)

A (B) solvent is not particularly limited as long as it can dissolve (A) resin. As long as a predetermined amount of the (A) resin is dissolved in the treatment liquid, the treatment liquid may include the (A) resin that is not dissolved and (B) solvent. It is preferable that the (A) resin is completely dissolved in the treatment liquid. When the treatment liquid includes insoluble matter, the insoluble matter may be attached to a surface of a surface of the first member 10 and/or the second member 11 at the time of formation of a hydrophilic coating film 12. In this case, the surface-treated surface of the first member 10 and/or the second member 11 is rinsed by a method to be described later, and thereby it is possible to remove the insoluble matter attached to the surface of the first member 10 and/or the second member 11.

The (B) solvent may be water or an organic solvent or an aqueous solution of an organic solvent.

Specific examples of the organic solvent used as the (B) solvent include: sulfoxides such as dimethylsulfoxide; sulfones such as dimethylsulfone, diethylsulfone, bis(2-hydroxyethyl)sulfone, and tetramethylene sulfone; amides such as N,N-dimethylformamide, N-methylformamide, N,N-dimethylacetamide, N-methylacetamide, and N,N-dimethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; dialkyl glycol ethers such as dimethyl glycol, dimethyl diglycol, dimethyl trigylcol, methylethyl diglycol, diethyl glycol, and triethylene glycol butyl methyl ether; (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; alkyl lactate esters such as methyl 2-hydroxypropionate, and ethyl 2-hydroxypropionate; other esters such as 2-hydroxy-2-methylpropionic acid ethyl, 3-methoxypropionic acid methyl, 3-methoxypropionic acid ethyl, 3-ethoxypropionic acid methyl, 3-ethoxypropionic acid ethyl, ethoxy acetic acid ethyl, hydroxyl acetic acid ethyl, 2-hydroxy-3-methylbutanoic acid methyl, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; lactones such as β-propiolactone, γ-butyrolactone, and δ-pentyrolactone; linear, branched, or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methyl cyclohexane; aromatic hydrocarbons such as benzene, toluene, xylene, 1,3,5-trimethyl benzene, and naphthalene; terpenes such as p-menthane, diphenyl menthane, limonene, terpinene, bornane, norbornane and pinane; and the like.

When the (B) solvent is a mixed solvent of water and an organic solvent, the content of the organic solvent in the (B) solvent is preferably 10 mass % or more, and more preferably 20 mass % or more.

(Other Components)

The treatment liquid may include various components other than the (A) resin, and a (B) solvent mentioned above, within a range in which the object of the present invention is not impaired. Examples of the other components include a pH adjustment agent, a coloring agent, a surface-active agent, a defoaming agent, a viscosity modifier, and the like.

The pH adjustment agent is not particularly limited, and various acids or bases can be used. Since a preferable effect of hydrophilization is achieved, pH of the treatment liquid is adjusted to preferably 5 or more and 14 or less, more preferably 5 or more and 12 or less, and particularly preferably 5 or more and 10 or less.

(Preparation Method of Treatment Liquid)

A method for preparing a treatment liquid is not particularly limited. The treatment liquid can be typically prepared by homogeneously mixing predetermined amounts of the (A) resin, and a (B) solvent, and the other components if necessary.

[Second Treatment Liquid]

Specific examples of the particularly preferable treatment liquid other than the first treatment liquid include a "second treatment liquid" described below. The second treatment liquid including (A) resin and a (B) solvent, wherein a ratio of a structural unit having an anionic group to total structural units of the (A) resin is 5 mol % or less, the (A) resin includes a functional group I that is a hydroxyl group and/or a cyano group, and a functional group II that is a hydrophilic group, wherein when the functional group II includes a hydroxyl group and/or a cyano group, the (A) resin may not have a functional group I; and the (A) resin has a cationic group including an anion moiety, and a cation moiety bonded to the (A) resin. The second surface treatment liquid has pH of 5 or more and 14 or less.

The second treatment liquid is the same as the first treatment liquid except that it is essential that pH is 5 or more and 14 or less. A method for adjusting pH is the same as described for the first treatment liquid.

The second treatment liquid is suitably used for making various materials hydrophilic, but similar to the first treatment liquid, the second surface treatment liquid is particularly preferably used for making a member including polyorganosiloxane on at least a part of the surface thereof hydrophilic.

A hydrophilic coating film is formed on a surface of the member using the above-described treatment liquid.

<Irradiation Step>

In the irradiation step as described above, in a member having a hydrophilic coating film, only a bonding surface of the hydrophilic coating film is selectively irradiated with ultraviolet rays or plasma derived from an oxygen-containing gas. Furthermore, as to a member having no hydrophilic coating film, at least a bonding surface is irradiated with ultraviolet rays or plasma derived from an oxygen-containing gas.

When irradiation with ultraviolet ray is carried out, the wavelength and an exposure amount of the ultraviolet ray is not particularly limited within a range where the objects of the present invention are not impaired. From the viewpoint that removal of the hydrophilic coating film and activation by irradiation with ultraviolet rays or plasma are easily satisfactorily proceeded simultaneously, the wavelength of the ultraviolet ray is preferably 254 nm or less, and more preferably 172 nm or less. From the same viewpoint, the exposure amount is preferably 400 $mJ/cm^2$ or more and 5000 $mJ/cm^2$ or less, and more preferably 500 $mJ/cm^2$ or more and 2000 $mJ/cm^2$ or less.

When irradiation with plasma is carried out, examples of the oxygen-containing gas include an oxygen gas, air, and ozone. Furthermore, mixture gases of oxygen gas, air, or ozone with inert gases such as nitrogen, helium, and argon can be used as an oxygen-containing gas.

As mentioned above, irradiation with ultraviolet rays or plasma derived from an oxygen-containing gas was carried out to a joining surface as a region to be compression-bonded among a surface having the hydrophilic coating film, when the hydrophilic coating film is removed while the surface of the joining surface is activated such that compression bonding can be carried out.

<Compression Bonding Step>

In the compression bonding step, an external force is applied to two or more members placed in the predetermined position such that the joining surfaces of the two or more members having been treated with ultraviolet rays or plasma face each other, thus compression bonding the joining surfaces to each other.

A load applied to the two or more members at the time of compression bonding is not particularly limited as long as the members are not destroyed and the two or more members are satisfactorily compression-bonded to each other. The range of the load is, for example, preferably 0.05 kgf or more and 5 kgf or less, more preferably 0.1 kgf or more and 3 kgf or less, and further preferably 0.2 kgf or more and 2 kgf or less.

Time for applying the load is not particularly limited, and, it is, for example, preferably 5 seconds or more, further preferably 10 seconds or more, and particularly preferably 30 seconds or more. The upper limit of time for applying the load is not particularly limited, and is appropriately determined in consideration of the productivity of the flow path device. Time for applying the load may be, for example, 60 hours or less, 10 hours or less, 1 hour or less, or 10 minutes or less.

After a load is applied, in order to further ensure the compression bonding, it is preferable to allow a flow path device, which has been formed by compression bonding, to stand still if necessary. Time for still-standing time is not particularly limited, and the time is preferably 10 minutes or more, more preferably 20 minutes or more, and further preferably 30 minutes or more. The upper limit of the standing time is not particularly limited, and is appropriately determined in consideration of the productivity of the flow path device. The still-standing time may be, for example, 100 hours or less, 50 hours or less, 10 hours or less, 5 hours or less, or 1 hour or less.

According to the method including the coating film formation step, the irradiation step, and the compression bonding step described above, it is possible to manufacture a flow path device capable of maintaining the hydrophilic property on the surface of a flow path for a long period of time.

The method described above is preferably a method using two members including a first member and a second member as the two or more members, wherein the first member is a plate-like member provided with a groove corresponding to the flow path, the second member is a plate-like member having a surface having no level difference and made of a flow path surface and a joining surface, as the surface to be joined to the first member, and the flow path surface of the second member seals an opening of the groove of the first member so as to form the flow path. According to such a method, since a surface of the second member at a side to be joined to the first member is the inside of the step difference, when the first member and the second member are compression bonded, without positioning the two members precisely, a flow path device having a desired shape can be manufactured easily.

Hereinafter, a representative example of the above-mentioned manufacturing method is described with reference to FIG. 1 (FIGS. 1(a1), 1(a2), 1(b1), 1(b2), 1(c1), 1(c2), and 1(d)). Note here that the number or shapes of members constituting a flow path device, a shape of the flow path device, and the like, are not necessarily limited to the embodiments shown in FIG. 1.

(Coating Film Formation Step)

In the coating film formation step, firstly, two or more members are prepared as members constituting the flow path device 1. Shapes and sizes of the two or more members are not particularly limited as long as all the members can be combined so as to manufacture a flow path device. FIG. 1 illustrates a method for manufacturing a flow path device 1 using two members including a first member 10 having a recess portion corresponding to a flow path, and a second member 11 having a flat shape. FIG. 1(a1) shows the first member 10, and FIG. 1 (a2) shows second member 11.

Materials of the first member 10 and the second member 11 are described above.

In the coating film formation step, in at least one of the first member 10 and the second member 11, a hydrophilic coating film 12 is formed on surface at a side to be joined to another member of the members using a treatment liquid including a hydrophilizing agent.

In FIGS. 1(b1) and 1(b2), a hydrophilic coating film 12 is formed on both a surface at a side to which the first member 10 to be joined, and a surface at a side to which the second member 11 to be joined. The hydrophilic coating film 12 may be formed on a surface other than the joining surface. However, since a process of forming the hydrophilic coating film 12 becomes complicated, the hydrophilic coating film 12 is preferably formed only on a surface at a side to which a member is to be joined.

A thickness of the hydrophilic coating film 12 is not particularly limited within a range where the objects of the present invention are not impaired. The range of the thickness of the hydrophilic coating film 12 is as described above.

(Irradiation Step)

In an irradiation step, as shown in FIGS. 1(c1) and 1(c2), in a member (the first member 10 and/or the second member 11) having the hydrophilic coating film 12, only the joining surface of the hydrophilic coating film 12 is selectively irradiated with ultraviolet rays or plasma derived from an oxygen-containing gas. In FIG. 1, both the first member 10 and the second member 11 have the hydrophilic coating film 12, but in a member that does not having the hydrophilic coating film 12, at least the joining surface is irradiated with ultraviolet rays or plasma derived from an oxygen-containing gas.

Conditions of the irradiation with ultraviolet rays or plasma derived from an oxygen-containing gas are described above.

(Compression Bonding Step)

In a compression bonding step, the first member 10 and the second member 11 having been treated with ultraviolet rays or plasma, as shown in FIG. 1(d), both members are placed in the predetermined positions such that respective joining surfaces face each other. Then, an external force is applied to both the first member 10 and the second member 11 placed in the predetermined positions, so that the joining surfaces are compression-bonded to each other.

Conditions for the compression bonding are described above.

According to the above-described method, a flow path device capable of maintaining hydrophilic property of the surface of the flow path for a long period of time can be easily manufactured.

EXAMPLES

Hereinafter, the present invention will be explained more specifically by way of Examples. The scope of the present invention is not limited to these Examples.

Example 1

In Example 1, by compression-bonding two flat polydimethylsiloxane sheets to each other by the above-described method, an effect of hydrophilization by a hydrophilic coating film and an effect of easy and strong compression bonding were verified in a simulative manner.

Sylgard184 (manufactured by Shin-Etsu Chemical Co., Ltd.) was applied on a silicon wafer, and then the coating film was heated at 150° C. for 30 minutes to prepare two polydimethylsiloxane sheets. One surface of the obtained polydimethylsiloxane sheet was irradiated with ultraviolet rays having a wavelength of 172 nm in an irradiation amount of 364 mJ/cm$^2$ by using a vacuum ultraviolet ray irradiation apparatus (EX-400, manufactured by Hamamatsu Photonics K.K), and pretreatment for formation of the hydrophilic coating film was performed. Then a hydrophilic coating film was formed using an aqueous solution of the following Resin 1 having a concentration of 1 mass % as a treatment liquid. In the following formula, n, m, and l described at the right lower of parenthesis denote mol % of each structural unit in the total structural units in the resin. n is 70 mol % or more and 90 mol % or less; m is 5 mol % or more and 20 mol % or less; and l is 5 mol % or more and 10 mol % or less.

[Chem. 8]

Resin 1

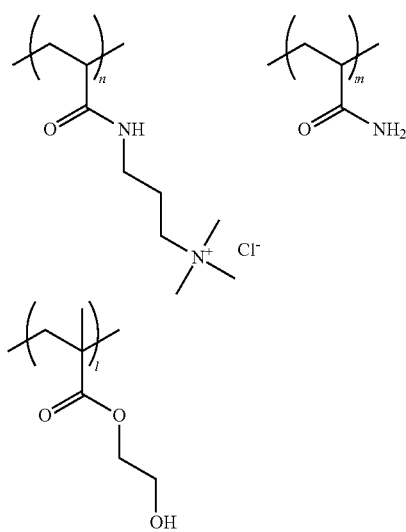

More specifically, the above-mentioned treatment liquid was dropped to a surface of the polydimethylsiloxane sheet irradiated with ultraviolet rays using a pipette and applied to spread, then a coating film was dried at 80° C. for 5 minutes, and then the surface of the coating film was rinsed with flowing water to form a hydrophilic coating film. A film thickness of the formed hydrophilic coating film measured by ellipsometry was 2 nm.

The water contact angle of the surface having the hydrophilic coating film was measured one hour, three hours, twelve hours, and one week after the formation of the hydrophilic coating film, and the change of the effect of hydrophilization over time was evaluated. The water contact angle was measured as a contact angle as follows: a pure water droplet (2.0 μL) was dropped onto a surface of a surface-treated substrate using Dropmaster 700 (manufactured by Kyowa Interface Science Co., Ltd.), and the contact angle was measured after 10 seconds of dropping. As a result of the evaluation mentioned above, water contact angle of the surface having a hydrophilic coating film on the polydimethylsiloxane sheet was less than 10° and stable at any measurement times after one hour, three hours, and twelve hours. Furthermore, even in measurement after one week, the water contact angle was as low as 20° or less. Note here that the water contact angle of the surface of the polydimethylsiloxane sheet having no hydrophilic coating film on the surface was 110°.

Only a region to be joined to another sheet in the surfaces on which two polydimethylsiloxane sheets having the above-mentioned hydrophilic coating film on one surface thereof were formed was subjected to irradiation with ultraviolet rays having a wavelength of 171 nm in an irradiation amount of 728 mJ/cm$^2$ by using a vacuum ultraviolet ray irradiation apparatus (EX-400, manufactured by Hamamatsu Photonics K.K), and to activation of the surface. The two polydimethylsiloxane sheets were placed such that a surface activated by irradiation with ultraviolet rays face each other, and then 1 kgf of load was applied thereto for one minute so as to compression-bond the two polydimethylsiloxane sheets. When the two compression-bonded polydimethylsiloxane sheets were allowed to stand still at room temperature for 48 hours, and then a compression bonding state of the two sheets was verified, the two sheets were strongly bonded to each other and not peeled off from each other.

Example 2

Formation of a hydrophilic coating film, irradiation of a surface on which the hydrophilic coating film had been formed with ultraviolet rays, and compression bonding of two polydimethylsiloxane sheets were performed in the same manner as in Example 1 except that as pretreatment for formation of a hydrophilic coating film, irradiation with oxygen plasma was performed under the conditions of oxygen of 100%, RF Power of 50 W, and for 10 seconds using Oxygen Plasma Apparatus (TCA-3822, manufactured by TOKYO OHKA KOGYO CO LTD) instead of irradiation with ultraviolet rays using a vacuum ultraviolet ray irradiation apparatus. When the two compression-bonded polydimethylsiloxane sheets were allowed to stand still at room temperature for six hours, and then a compression bonding state of the two sheets was verified, the two sheets were strongly compression-bonded and not peeled off from each other.

Example 3

Formation of a hydrophilic coating film, irradiation of a surface on which the hydrophilic coating film had been formed with ultraviolet rays, and compression bonding of two polydimethylsiloxane sheets were performed in the same manner as in Example 2 except that an exposure amount at the time of irradiation with ultraviolet rays for surface activation to the surface on which the hydrophilic coating film had been formed was changed from 728 mJ/cm$^2$ to 1092 mJ/cm$^2$. When the two compression-bonded polydimethylsiloxane sheets were allowed to stand still at room temperature for six hours, and then a compression bonding state of the two sheets was verified, the two sheets were strongly compression-bonded and not peeled off from each other.

Example 4

Formation of a hydrophilic coating film, irradiation of a surface on which the hydrophilic coating film had been formed with ultraviolet rays, and compression bonding of two polydimethylsiloxane sheets were performed in the same manner as in Example 2 except that an exposure amount at the time of irradiation with ultraviolet rays for surface activation to the surface on which the hydrophilic coating film had been formed was changed from 728 mJ/cm² to 546 mJ/cm². When the two compression-bonded polydimethylsiloxane sheets were allowed to stand still at room temperature for six hours, and then a compression bonding state of the two sheets was verified, the two sheets were strongly compression-bonded and not peeled off from each other.

Comparative Example 1

Formation of a hydrophilic coating film, and compression bonding of two polydimethylsiloxane sheets were performed in the same manner as in Example 2 except that irradiation with ultraviolet rays for surface activation to a surface on which the hydrophilic coating film had been formed was not performed. After the two compression-bonded polydimethylsiloxane sheets were allowed to stand still at room temperature for 13 hours, when a compression bonding state of the two sheets was verified, the two sheets were easily peeled off from the compression-bonded interface.

EXPLANATION OF REFERENCE NUMERALS 1 flow path device
10 first member
11 second member
12 hydrophilic coating film

What is claimed is:

1. A method for manufacturing a flow path device internally provided with a flow path for allowing a liquid to flow, the method comprising:
preparing two or more members as members constituting the flow path device, and forming a hydrophilic coating film in at least one member of the members, using a treatment liquid including a hydrophilizing agent, the hydrophilic coating film covering a surface of the member at a side to be joined to another member;
selectively irradiating only a joining surface of the hydrophilic coating film with ultraviolet rays or plasma derived from an oxygen-containing gas in (A) a member having the hydrophilic coating film, thereby removing the hydrophilic coating film in the joining surface and activating a surface of the joining surface, and irradiating at least the joining surface with ultraviolet rays or plasma derived from an oxygen-containing gas in (B) a member in which no hydrophilic coating film has been formed in the coating film formation, thereby activating a surface of the joining surface; and
applying an external force to the two or more members disposed in predetermined positions such that the joining surfaces of the two or more members face each other, so as to compression bond the joining surfaces, with the joining surfaces having been irradiated with the ultraviolet rays or the plasma and activated.

2. The method according to claim 1, wherein a portion that is not irradiated with ultraviolet rays or plasma derived from an oxygen-containing gas in the hydrophilic coating film is a surface of the flow path of the flow path device.

3. The method according to claim 1, wherein the hydrophilic coating film is formed in all of the two or more members.

4. The method according to claim 1, wherein before the hydrophilic coating film is formed, a surface on which the hydrophilic coating film is to be formed is subjected to treatment of irradiating the surface with ultraviolet rays or plasma derived from an oxygen-containing gas, or treatment of bringing the surface into contact with an oxidant.

5. The method according to claim 4, wherein the oxidant is at least one selected from the group consisting of sulfuric acid, nitric acid, chromic acid, permanganic acid, persulfuric acid, and mixed acid.

6. The method according to claim 1, wherein the hydrophilizing agent is an organic compound, and a film thickness of the hydrophilic coating film is 100 nm or less.

7. The method according to claim 1, wherein the irradiation with the ultraviolet rays is performed in the irradiation step, and a wavelength of the ultraviolet rays is 254 nm or less.

8. The method according to claim 7, wherein the wavelength of the ultraviolet rays is 172 nm or less.

9. The method according to claim 1, wherein a material of a surface at a side to be joined to another member of the members is one or more materials selected from the group consisting of silicon, glass, a silicone resin, a cyclic olefin polymer, a cyclic olefin copolymer, an acrylic resin, a polyester resin, and a polycarbonate resin.

10. The method according to claim 1, wherein
the two or more members comprise two members including a first member and a second member,
the first member is a plate-like member provided with a groove corresponding to the flow path,
the second member is a plate-like member having a surface having no level difference and made of a flow path surface and a joining surface, as the surface to be joined to the first member, and
the flow path surface of the second member seals an opening of the groove of the first member so as to form the flow path.

11. The method for manufacturing a flow path device according to claim 1, wherein the hydrophilizing agent comprises a (meth)acrylic resin having a functional group I that is a hydroxyl group and/or a cyano group and optionally a functional group II that is a hydrophilic group other than the functional group I.

12. The method for manufacturing a flow path device according to claim 1, wherein the material of a surface at a side to be joined to another member of the members is polyorganosiloxane.

13. The method for manufacturing a flow path device according to claim 1, wherein an exposure amount of the irradiation is 400 mJ/cm² or more and 5,000 mJ/cm² or less.

* * * * *